US009070820B2

(12) United States Patent
Dubois et al.

(10) Patent No.: US 9,070,820 B2
(45) Date of Patent: Jun. 30, 2015

(54) METHOD FOR HEAT-TREATING A SILICON SUBSTRATE FOR THE PRODUCTION OF PHOTOVOLTAIC CELLS, AND PHOTOVOLTAIC CELL PRODUCTION METHOD

(75) Inventors: Sebastien Dubois, Scionzier (FR); Nicolas Enjalbert, Burlats (FR)

(73) Assignee: Commissariat a L'Energie Atomique et aux Energies Alternatives, Paris (FR)

( * ) Notice: Subject to any disclaimer, the term of this patent is extended or adjusted under 35 U.S.C. 154(b) by 454 days.

(21) Appl. No.: 13/514,836

(22) PCT Filed: Dec. 8, 2010

(86) PCT No.: PCT/FR2010/000824
§ 371 (c)(1),
(2), (4) Date: Jul. 25, 2012

(87) PCT Pub. No.: WO2011/070254
PCT Pub. Date: Jun. 16, 2011

(65) Prior Publication Data
US 2012/0329194 A1 Dec. 27, 2012

(30) Foreign Application Priority Data
Dec. 10, 2009 (FR) .................................. 09 05971

(51) Int. Cl.
*H01L 31/18* (2006.01)
*C01B 33/037* (2006.01)
(Continued)

(52) U.S. Cl.
CPC .......... *H01L 31/1864* (2013.01); *C01B 33/037* (2013.01); *C30B 28/06* (2013.01);
(Continued)

(58) Field of Classification Search
CPC ............ H01L 21/3225; H01L 21/3226; H01L 21/3221; H01L 29/32; H01L 31/022425; C30B 29/06; C30B 25/02; C30B 33/00
USPC ..................... 257/E21.321, E21.32, E21.211, 257/E21.318; 438/471, 473; 117/20
See application file for complete search history.

(56) References Cited

U.S. PATENT DOCUMENTS

2002/0121242 A1* 9/2002 Minami et al. ................. 118/724
2003/0207044 A1* 11/2003 Sopori .......................... 427/551
(Continued)

FOREIGN PATENT DOCUMENTS

EP 2 107 619 A2 10/2009

OTHER PUBLICATIONS

Perichaud I. et al. "Limiting Factors of Gettering Treatment in mc-Si Wafers from the Metallurgical Route," Materials Science and Engineering B 159-160, (2009) 256-258.*
(Continued)

*Primary Examiner* — David Vu
*Assistant Examiner* — Jonathan Han
(74) *Attorney, Agent, or Firm* — Alston & Bird LLP

(57) ABSTRACT

The invention relates to a method for treating a silicon substrate for the production of photovoltaic cells against reduction in yield during the illumination of said photovoltaic cells. The invention also relates to a method for producing photovoltaic cells from the treated substrate. To said end, the invention relates to a method for treating a silicon substrate for the production of photovoltaic cells, said method including the following steps: a) providing a silicon substrate obtained from a metallurgically purified load, and b) annealing said substrate by heating the substrate to a temperature between 880° C. and 930° C. for a duration of between one and four hours, preferably at a temperature of 900° C., give or take 10° C., for two hours, give or take 10 minutes.

17 Claims, 1 Drawing Sheet

(51) Int. Cl.
*C30B 28/06* (2006.01)
*C30B 29/06* (2006.01)
*C30B 33/02* (2006.01)
*H01L 21/322* (2006.01)

(52) U.S. Cl.
CPC ............... *C30B 29/06* (2013.01); *C30B 33/02* (2013.01); *H01L 21/3221* (2013.01); *H01L 31/1804* (2013.01); *Y02E 10/547* (2013.01)

(56) References Cited

U.S. PATENT DOCUMENTS

2004/0005777 A1* 1/2004 Qu et al. .................. 438/689
2009/0211635 A1* 8/2009 Niira et al. ................ 136/258
2009/0253225 A1 10/2009 Dubois et al.

OTHER PUBLICATIONS

International Search Report and Written Opinion for Application No. PCT/FR2010/000824 dated Jun. 6, 2011.
Binetti, S. et al., *Study of Defects and Impurities in Multicrystalline Silicon Grown From Metallurgical Silicon Feedstock*, Materials Science and Engineering B 159-160 (2009) 274-277.
Gee, J. M., *Phosphorous Diffusions For Gettering-Induced Improvement of Lifetime in Various Silicon Materials*, IEEE (1991) 116-123.
Perichaud, I., *Gettering of Impurities in Solar Silicon*, Solar Energy Materials & Solar Cells 72 (2002) 315-326.
Perichaud, I. et al., *Limiting Factors of Gettering Treatment in mc-Si Wafers from the Metallurgical Route*, Materials Science and Engineering B 159-160 (2009) 256-258.

* cited by examiner

Fig. 1
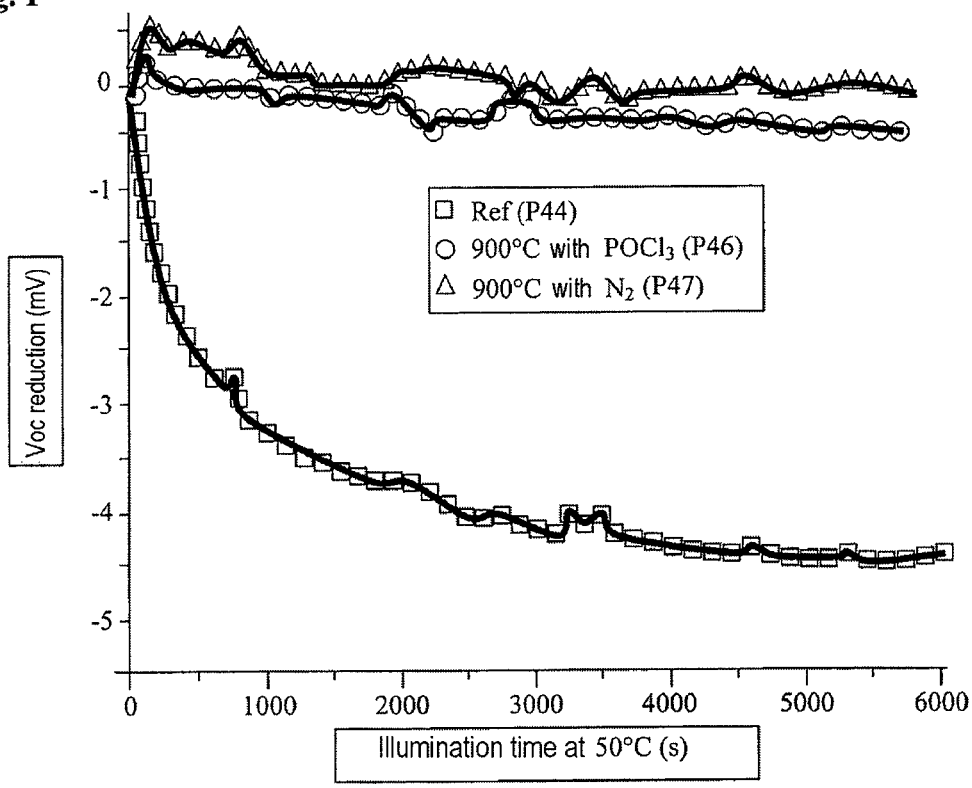
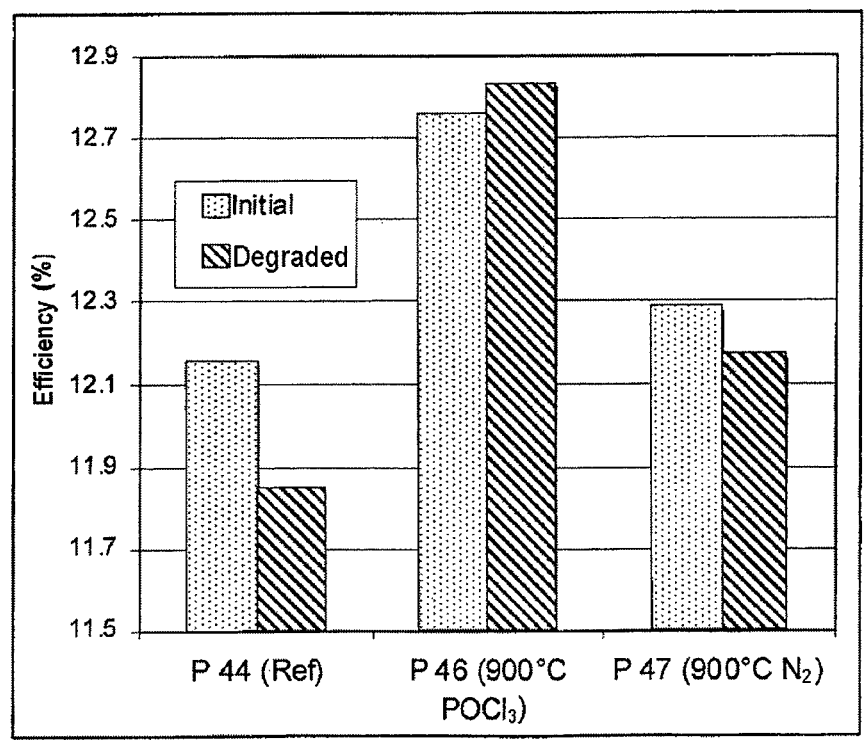
Fig. 2

METHOD FOR HEAT-TREATING A SILICON SUBSTRATE FOR THE PRODUCTION OF PHOTOVOLTAIC CELLS, AND PHOTOVOLTAIC CELL PRODUCTION METHOD

CROSS-REFERENCE TO RELATED APPLICATION

This application is a national stage application filed under 35 U.S.C. 371 of International Application No. PCT/FR2010/000824, filed Dec. 8, 2010, which claims priority from French Application No. 0905971, filed Dec. 10, 2009, each of which is incorporated by reference herein in its entirety.

FIELD

The invention relates to a process for treating a silicon substrate for manufacturing photovoltaic cells, preventing efficiency decrease under illumination. The invention also relates to a process for manufacturing photovoltaic cells using the treated substrate.

BACKGROUND

Many studies have aimed to produce low-cost silicon feedstock that will be used for growing single-crystal and polycrystalline ingots and for pulling ribbon wafers for manufacturing photovoltaic cells. This "low-cost" feedstock may be obtained by metallurgical purification of the silicon. Metallurgical purification is a purification method in which the silicon never passes into the gaseous phase.

The metallurgically obtained feedstock often contains much greater amounts of dopant impurities (mainly boron and phosphorus) than electronic grade silicon feedstock. In this metallurgically obtained feedstock, the quantities of boron (electron acceptor atom in silicon) and phosphorus (electron donor atom in silicon) are often of the same order of magnitude. "Compensated feedstock" is spoken of.

Photovoltaic cells manufactured using such feedstock often have an energy conversion efficiency that decreases under illumination. This effect is related to the formation, under illumination, of complexes associating a boron atom in a substitutional position ($B_s$) with an oxygen dimer ($O_{2i}$). Under illumination the (mobile) oxygen dimer diffuses toward the (immobile) boron atom. The complex formed introduces a deep energy level into the bandgap of the silicon, thereby making recombination of free charge possible, and consequently reducing the lifetime of charge carriers and the energy conversion efficiency of the cell. This degradation has a substantial effect on the conversion efficiency of the cells. Specifically, the efficiency reduction may be about 8 rel. %. This reduction is calculated in the following way: (final efficiency−initial efficiency)/initial efficiency.

Thus, it is important to provide solutions capable of reducing or even preventing the effects of this degradation.

SUMMARY

The object of the invention is therefore to provide a process for manufacturing photovoltaic cells that reduces the efficiency degradation under illumination.

To this end, the invention relates to a process for treating a silicon substrate for manufacturing photovoltaic cells, comprising the following steps:

a) providing a silicon substrate obtained from a metallurgically purified feedstock;

b) annealing this substrate by heating it to a temperature of between 880° C. and 930° C. for a time of between one and four hours, preferably to a temperature of 900° C.±about 10° C. for two hours±about 10 minutes.

According to other embodiments:

the substrate provided in step a) may have a total carbon content of between $2 \times 10^{18}$ cm$^{-3}$ and $10^{19}$ cm$^{-3}$ and preferably a total carbon content of $6.5 \times 10^{18}$ cm$^{-3}$;

the carbon may be introduced during the manufacture of the substrate;

the process may comprise the following steps:
providing a metallurgically purified feedstock;
crystallizing the feedstock to obtain a silicon substrate, such that, during the crystallization, this substrate is annealed by heating it to a temperature of between 880° C. and 930° C. for a time of between one and four hours, preferably to a temperature of 900° C.±about 10° C. for two hours±about 10 minutes;

the process may comprise the following steps:
providing a metallurgically purified feedstock;
crystallizing the feedstock in order to obtain a silicon substrate, preferably taking the form of an ingot;
after crystallization, annealing at least part of the obtained substrate by placing it in a furnace at a temperature of between 880° C. and 930° C. for a time of between one and four hours, preferably at a temperature of 900° C.±about 10° C. for two hours±about 10 minutes;

the process may comprise the following steps:
providing a metallurgically purified feedstock;
crystallizing the feedstock in order to obtain a silicon substrate, preferably taking the form of an ingot;
sawing the substrate obtained into wafers;
annealing the wafers by heating them to a temperature of between 880° C. and 930° C. for a time of between one and four hours, preferably to a temperature of 900° C.±about 10° C. for two hours±about 10 minutes;
implementing a step of etching the surfaces of the wafers obtained in the preceding step;
texturing the surfaces of the wafers;

the process may comprise the following steps:
providing a metallurgically purified feedstock;
crystallizing the feedstock in order to obtain a silicon substrate, preferably taking the form of an ingot;
sawing the substrate obtained into wafers;
texturing the surfaces of the wafers;
annealing the wafers by heating them to a temperature of between 880° C. and 930° C. for a time of between one and four hours, preferably to a temperature of 900° C.±about 10° C. for two hours±about 10 minutes;
implementing a step of etching the surfaces of the wafers obtained in the preceding step;

the process may comprise the following steps:
providing a metallurgically purified feedstock;
crystallizing the feedstock in order to obtain a silicon substrate, preferably taking the form of an ingot;
sawing the substrate obtained into wafers;
texturing the surfaces of the wafers in two stages, between which the wafers are annealed by heating them to a temperature of between 880° C. and 930° C. for a time of between one and four hours, preferably to a temperature of 900° C.±about 10° C. for two hours±about 10 minutes;

the annealing step may be carried out in air, in a nitrogen stream or in a POCl$_3$ stream.

The invention also relates to a process for fabricating photovoltaic cells, comprising the following steps:

treating a silicon substrate in accordance with the above process; and then producing photovoltaic cells using this substrate, by locally introducing dopant elements, such as phosphorus or boron, into the annealed substrate, or into part of this substrate, in order to produce a p-n junction.

BRIEF DESCRIPTION OF THE DRAWINGS

Other features of the invention will become clear from the detailed description below, given with reference to the appended figures, which respectively show:

FIG. 1, a graph illustrating the variation under illumination at 50° C. of the open circuit voltage (Voc) of photovoltaic cells produced from wafers located at 20% of the height of the ingot (lower part of the ingot); and FIG. 2, a graph illustrating the conversion efficiency of cells before and after illumination for a sufficient amount of time to degrade the electrical performance of the cells, and the influence of the 2 hour-long 900° C. anneal on this efficiency.

DETAILED DESCRIPTION

According to the invention, carrying out a high-temperature anneal before forming the p-n junction by localized diffusion of dopant elements allows the degradation of the conversion efficiency under illumination to be reduced and even prevented.

The anneal according to the invention consists in heating the silicon substrate to a temperature of between 880° C. and 930° C. for a time of between one and four hours. Preferably, the anneal is carried out at a temperature of 900° C.±about 10° C. for two hours±about 10 minutes.

This anneal must be carried out before the step of forming the p-n junction (by localized diffusion of dopant elements: phosphorus if the substrate is p-type, or by diffusion of boron if the substrate is n-type).

This anneal has a particularly beneficial effect on the efficiency stability of the photovoltaic cell if the substrate (silicon wafers or blocks) contains a total carbon content (dissolved and precipitated carbon) of between $2 \times 10^{18}$ cm$^{-3}$ and $10^{19}$ cm$^{-3}$ with, preferably, a carbon content of $6.5 \times 10^{18}$ cm$^{-3}$.

These high carbon contents may simply be related to contamination of the silicon with carbon caused by the purification process. The carbon may also be intentionally introduced in a previous step in the manufacture of the substrate (ingot growth).

Thus, in accordance with the invention, this anneal may be implemented at various points during the fabrication of a PV cell:

in the crystallization step, during the cooling, by inserting a stage at 900° C. for 2 hours. The thermal budget is then advantageously limited since the ingot has already been heated to a high temperature during the crystallization. This also allows high production rates to be maintained since no additional step is necessary;

after the crystallization step, by placing the ingot or blocks (blocks denoting ingot pieces from which the wafers will be cut to form the cells) in a furnace at 900° C. for 2 hours. The advantage of this solution is that it allows large amounts of silicon to be treated at the same time and it may therefore be easily integrated into a production line;

after the step of sawing the ingot into wafers and before the texturing of the surfaces. This solution is advantageous in that it makes optional additional chemical etching or cleaning of the surfaces redundant. In contrast, the drawback of this anneal is that it is carried out in the presence of a work-hardened layer (layer rich in defects and impurities created by the sawing step) from which defects and impurities may diffuse during the anneal, contaminating the bulk of the wafers;

by separating the texturing step into two steps. For example, KOH texturing takes 40 minutes. Thus, after 20 minutes of texturing the wafers may be removed from the bath and the anneal may be carried out before the wafers are once more placed in the KOH bath to finish the texturing (another 20 minutes). The advantage of this technique is that if the anneal is carried out in an oxidizing atmosphere, or for example in a POCl$_3$ stream, the second texturing step allows any glass formed during the anneal, or any possible diffused layer, adversely affecting the operation of the cell, to be removed;

by carrying out the anneal at 900° C. for 2 hours after the texturing and before forming the emitter. In contrast, if the surface oxidizes, or if a diffused layer forms thereon during the anneal, it is then necessary to remove the oxide layer (HF dip for example) or even to etch the diffused layer (solutions based on KOH, (HF, HNO$_3$, H$_2$O), (HF, HNO$_3$, CH$_3$COOH)); and this annealing step may finally take place in the same furnace as that used to form the emitter, by inserting, before the (phosphorus or boron) diffusion step, a stage at 900° C. for 2 hours. This solution has the disadvantage that, during this stage, the surface may easily oxidize and a slight diffusion of dopant species may also take place, thereby adversely affecting the quality of the emitter formed.

Preferably, the anneal is carried out in a POCl$_3$ stream. This is because the diffusion of phosphorus produces an external gettering (extraction and trapping at the surface) of metal impurities, thus improving the electrical properties of the material or extracting possible initially precipitated metallic impurities that redissolve under the effect of the high temperatures used in the anneal.

A comparative study was carried out. In this study, the silicon wafers used were crystallized from metallurgically purified feedstock. The boron and phosphorus content in the feedstock (therefore before crystallization of the ingot) was $1.8 \times 10^{17}$ cm$^{-3}$ and $4.3 \times 10^{17}$ cm$^{-3}$, respectively. These concentrations were measured by GDMS (glow-discharge mass spectrometry).

After crystallization, the part of the ingot used was p-type.

Three wafers were used in this study. These three wafers were obtained by sawing the ingot three times in succession at about 20% of the height of the ingot (lower part of the ingot). Thus, the wafers were "juxtaposed" in the ingot. By proceeding in this way it was ensured that the wafers had properties that were as similar as possible.

The KOH texturing was carried out in two steps of 2×20 minutes. Between these two texturing steps the first wafer, called the "reference" wafer, was not annealed, the second wafer was annealed at 900° C. for 2 hours in a nitrogen stream, and the third wafer was subjected to the same anneal but in a POCl$_3$ stream. The anneal was carried out in a conventional tube furnace. After the texturing, the wafers were subjected to a standard industrial process for manufacturing p-type cells (diffusion of phosphorus in a conventional tube furnace so as to produce at least one p-n junction, deposition of an antireflective SiN:H film on the front side, deposition of metal electrodes by screen printing, coanneal in a tunnel furnace and opening of the junction).

After the process, the current-voltage (I-V) characteristics of these cells were measured under illumination. Next, the cells were placed on a hotplate at 50° C. under 1 sun of illumination (AM 1.5, 0.1 W. cm$^{-2}$) and the variation in the open circuit voltage (Voc) was measured (FIG. 1). After the electrical properties of these cells had degraded under illumination, the I-V characteristics of the cells under illumination were remeasured and compared with the results of the measurements taken before the degradation (FIG. 2).

FIG. 1 shows the variation under illumination, at 50° C., of the Voc of cells produced from the three wafers that were located at about 20% of the height of the ingot. It may be seen that the Voc of the reference cell (having undergone no anneal) decreased by about 4.5 mV under illumination, whereas the Voc of the cells that did undergo an anneal remained constant. Thus, for this material, the addition of this annealing step allowed the effect of degradation of the conversion efficiency under illumination to be completely removed.

This is also illustrated in FIG. 2, which shows the values of the conversion efficiency of the cells before and after they had spent sufficient time under illumination for complete formation of $B/O_{2i}$ complexes. A person skilled in the art can easily determine this time.

This figure shows that the additional annealing step did not alter the electrical performance of the cells. In contrast, the initial efficiency (dotted histogram) of the cells that were annealed is higher. In addition, the reduction in the efficiency under illumination for the reference cell is 2.5 rel. % whereas it is almost zero for the cells that were annealed (hatched histogram).

The above experimental study was repeated on other materials with various amounts of compensation. Most of these materials were compensated metallurgically purified silicon, but the study was also extended to uncompensated chemically purified silicon. All the silicon wafers used were polycrystalline wafers.

For polysilicon, a temperature of 900° C. is the best for the anneal because above this temperature polysilicon is thermally unstable (dissolution of metal precipitates, propagation of dislocations, etc.). Nevertheless, the anneal may be carried out for this material at a temperature of up to 930° C., particularly when the anneal is carried out in $POCl_3$, the dissolution of metal impurities then being counterbalanced by the external gettering produced by the phosphorus diffusion. At 930° C., an anneal one hour in length is sufficient to obtain effects equivalent to an anneal at 900° C. for 2 hours. As for the lowest temperature, an anneal at 880° C. can be envisioned. In contrast, the duration of the anneal will then have to be multiplied by two (anneal of 4 hours), thereby making industrial integration of the anneal more problematic.

Next, photovoltaic cells are produced in the conventional way using the substrate obtained according to the invention.

The invention claimed is:

1. A process for treating a silicon substrate for manufacturing photovottaic cells, comprising the following steps:
   a) providing a silicon substrate obtained from a metallurgically purified feedstock;
   b) annealing this substrate by heating it to a temperature of between 880° C. and 930° C. for a time of between one and four hours, in which the substrate provided in step a) has a total carbon content of between $2 \times 10^{18}$ cm$^{-3}$ and $10^{19}$ cm$^{-3}$.

2. The treatment process as claimed in claim 1, in which the carbon is introduced during the manufacture of the substrate.

3. The treatment process as claimed in claim 1, comprising the following steps:
   providing a metallurgically purified feedstock;
   crystallizing the feedstock to obtain a silicon substrate, such that, during the cooling of the crystallization, this substrate is annealed by maintaining it to a temperature of between 880° C. and 930° C. for a time of between one and four hours.

4. The treatment process as claimed in claim 1, comprising the following steps:
   providing a metallurgically purified feedstock;
   crystallizing the feedstock in order to obtain a silicon ingot;
   after crystallization, annealing at least part of the obtained ingot by placing it in a furnace at a temperature of between 880° C. and 930° C. for a time of between one and four hours.

5. The treatment process as claimed in claim 1, comprising the following steps:
   providing a metallurgically purified feedstock;
   crystallizing the feedstock in order to obtain a silicon ingot;
   sawing the ingot obtained into wafers;
   annealing the wafers by heating them to a temperature of between 880° C. and 930° C. for a time of between one and four hours;
   implementing a step of etching the surfaces of the wafers obtained in the preceding step;
   texturing the surfaces of the wafers.

6. The treatment process as claimed in claim 1, comprising the following steps:
   providing a metallurgically purified feedstock;
   crystallizing the feedstock in order to obtain a silicon ingot;
   sawing the ingot obtained into wafers;
   texturing the surfaces of the wafers;
   annealing the wafers by heating them to a temperature of between 880° C. and 930° C. for a time of between one and four hours;
   implementing a step of etching the surfaces of the wafers obtained in the preceding step.

7. The treatment process as claimed in claim 1, comprising the following steps:
   providing a metallurgically purified feedstock;
   crystallizing the feedstock in order to obtain a silicon ingot;
   sawing the ingot obtained into wafers;
   texturing the surfaces of the wafers in two stages, between which the wafers are annealed by heating them to a temperature of between 880° C. and 930° C. for a time of between one and four hours.

8. The treatment process as claimed in claim 1, in which the annealing step is carried out in air, in a nitrogen stream or in a $POCl_3$ stream.

9. A process for fabricating photovoltaic cells, comprising the following steps:
   treating a silicon substrate in accordance with the process as claimed in claim 1;
   then producing photovoltaic cells using this substrate, by locally introducing dopant elements into the annealed substrate, or into part of this substrate, in order to produce a p-n junction.

10. The treatment process as claimed in claim 1, in which the substrate provided in step a) has a total carbon content of $6.5 \times 10^{18}$ cm$^{-3}$.

11. The treatment process as claimed in claim 1, comprising the following steps:
   providing a metallurgically purified feedstock;
   crystallizing the feedstock to obtain a silicon substrate, such that, during the crystallization, this substrate is annealed by heating it to a temperature of 900° C. ±about 10° C. for two hours ±about 10 minutes.

12. The treatment process as claimed in claim 1, comprising the following steps:
- providing a metallurgically purified feedstock;
- crystallizing the feedstock in order to obtain a silicon ingot;
- after crystallization, annealing at least part of the obtained ingot by placing it in a furnace at a temperature of 900° C. ±about 10° C. for two hours ±about 10 minutes.

13. The treatment process as claimed in claim 1, comprising the following steps:
- providing a metallurgically purified feedstock;
- crystallizing the feedstock in order to obtain a silicon ingot;
- sawing the ingot obtained into wafers;
- annealing the wafers by heating them to a temperature of 900° C. ±about 10° C. for two hours ±about 10 minutes;
- implementing a step of etching the surfaces of the wafers obtained in the preceding step;
- texturing the surfaces of the wafers.

14. The treatment process as claimed in claim 1, comprising the following steps:
- providing a metallurgically purified feedstock;
- crystallizing the feedstock in order to obtain a silicon ingot;
- sawing the ingot obtained into wafers;
- texturing the surfaces of the wafers;
- annealing the wafers by heating them to a temperature of 900° C. ±about 10° C. for two hours ±about 10 minutes;
- implementing a step of etching the surfaces of the wafers obtained in the preceding step.

15. The treatment process as claimed in claim 1, comprising the following steps:
- providing a metallurgically purified feedstock;
- crystallizing the feedstock in order to obtain a silicon ingot;
- sawing the ingot obtained into wafers;
- texturing the surfaces of the wafers in two stages, between which the wafers are annealed by heating them to a temperature of 900° C. ±about 10° C. for two hours ±about 10minutes.

16. A process for fabricating photovoltaic cells according to claim 9, characterized in that the step of annealing the substrate is performed before the step of forming the p-n junctions.

17. A process for treating a silicon substrate for manufacturing photovoltaic cells, comprising the following steps:
- a) providing a silicon substrate obtained from a metallurgically purified feedstock;
- b) annealing this substrate by heating it to a temperature of 900° C. ±about 10° C. for two hours ±about 10 minutes, in which the substrate provided instep a) has a total carbon content of between $2\times10^{18}$ cm$^{-3}$ and $10^{19}$ cm$^{-3}$.

* * * * *